(12) United States Patent
Yu

(10) Patent No.: US 8,847,658 B2
(45) Date of Patent: Sep. 30, 2014

(54) OVERDRIVE CIRCUITS AND RELATED METHOD

(71) Applicant: Taiwan Semiconductor Manufacturing Company, Ltd., Hsin-Chu (TW)

(72) Inventor: Ming-Hsin Yu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 59 days.

(21) Appl. No.: 13/755,834

(22) Filed: Jan. 31, 2013

(65) Prior Publication Data
US 2014/0062570 A1   Mar. 6, 2014

Related U.S. Application Data

(60) Provisional application No. 61/695,590, filed on Aug. 31, 2012.

(51) Int. Cl.
*H03L 5/00* (2006.01)

(52) U.S. Cl.
CPC .......................................... *H03L 5/00* (2013.01)
USPC ............................. 327/333; 327/108; 327/112

(58) Field of Classification Search
None
See application file for complete search history.

(56) References Cited

U.S. PATENT DOCUMENTS

| | | | | |
|---|---|---|---|---|
| 5,963,054 A | * | 10/1999 | Cochran et al. | 326/68 |
| 6,985,015 B2 | * | 1/2006 | Ajit | 327/108 |
| 7,545,357 B2 | * | 6/2009 | Miyazawa et al. | 345/100 |
| 7,868,658 B1 | * | 1/2011 | Miao | 326/68 |
| 2004/0160258 A1 | * | 8/2004 | Tobita | 327/333 |
| 2006/0012415 A1 | * | 1/2006 | Chen | 327/333 |
| 2009/0134930 A1 | * | 5/2009 | Tamura | 327/333 |
| 2011/0050318 A1 | * | 3/2011 | Lee | 327/333 |

* cited by examiner

*Primary Examiner* — Tuan T Lam
(74) *Attorney, Agent, or Firm* — Slater and Matsil, L.L.P.

(57) ABSTRACT

An overdrive circuit includes a pull-up circuit and a pull-down circuit. The pull-down circuit includes first, second and third transistors electrically connected in cascode between an output node and a low voltage supply node. A capacitor is electrically connected from a gate electrode of the third transistor to a gate electrode of the first transistor. A first mono-directional bias device is electrically connected from a drain electrode of the first transistor to a gate electrode of the first transistor. A second mono-directional bias device is electrically connected from the gate electrode of the first transistor to a source electrode of the first transistor.

19 Claims, 7 Drawing Sheets

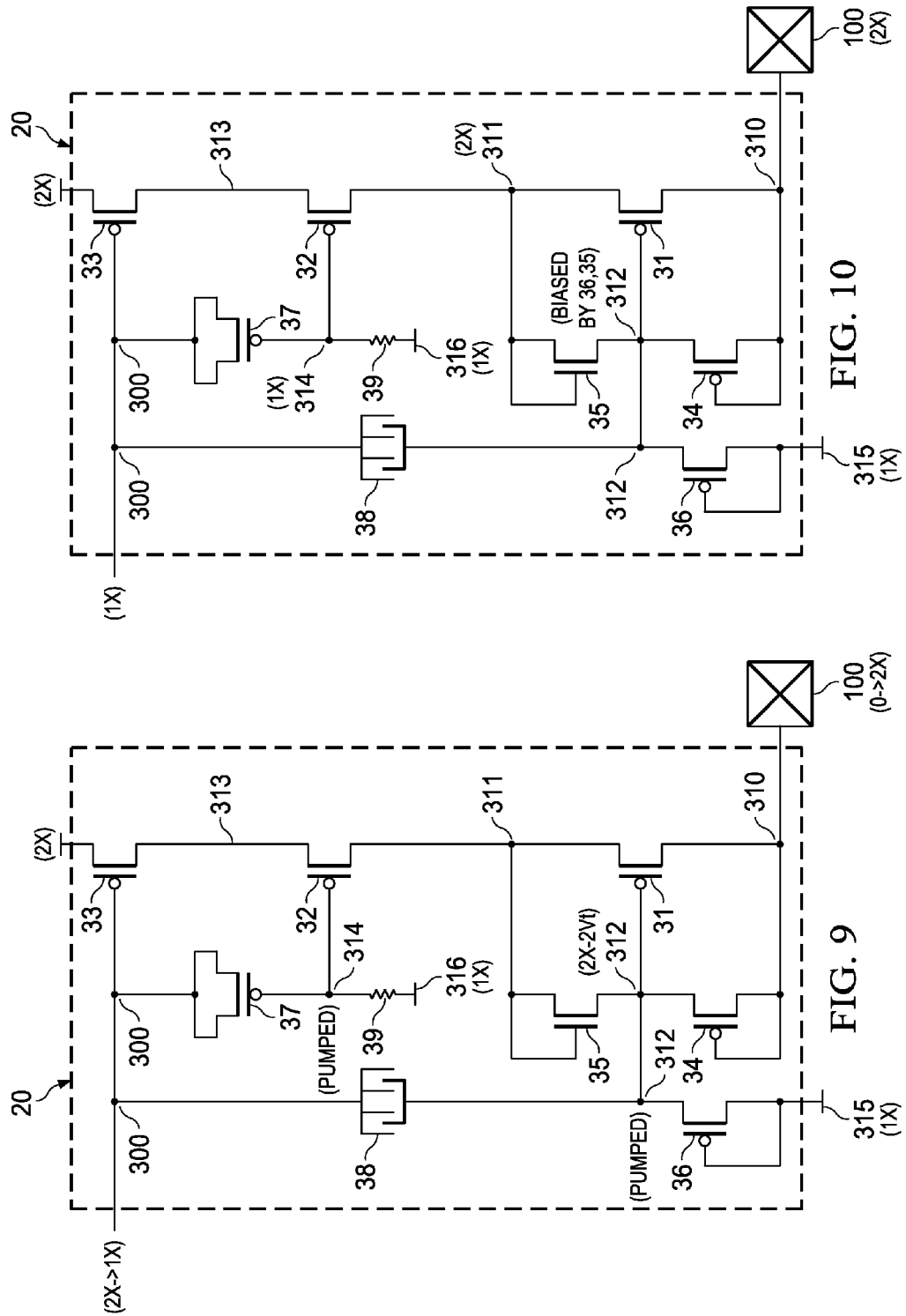

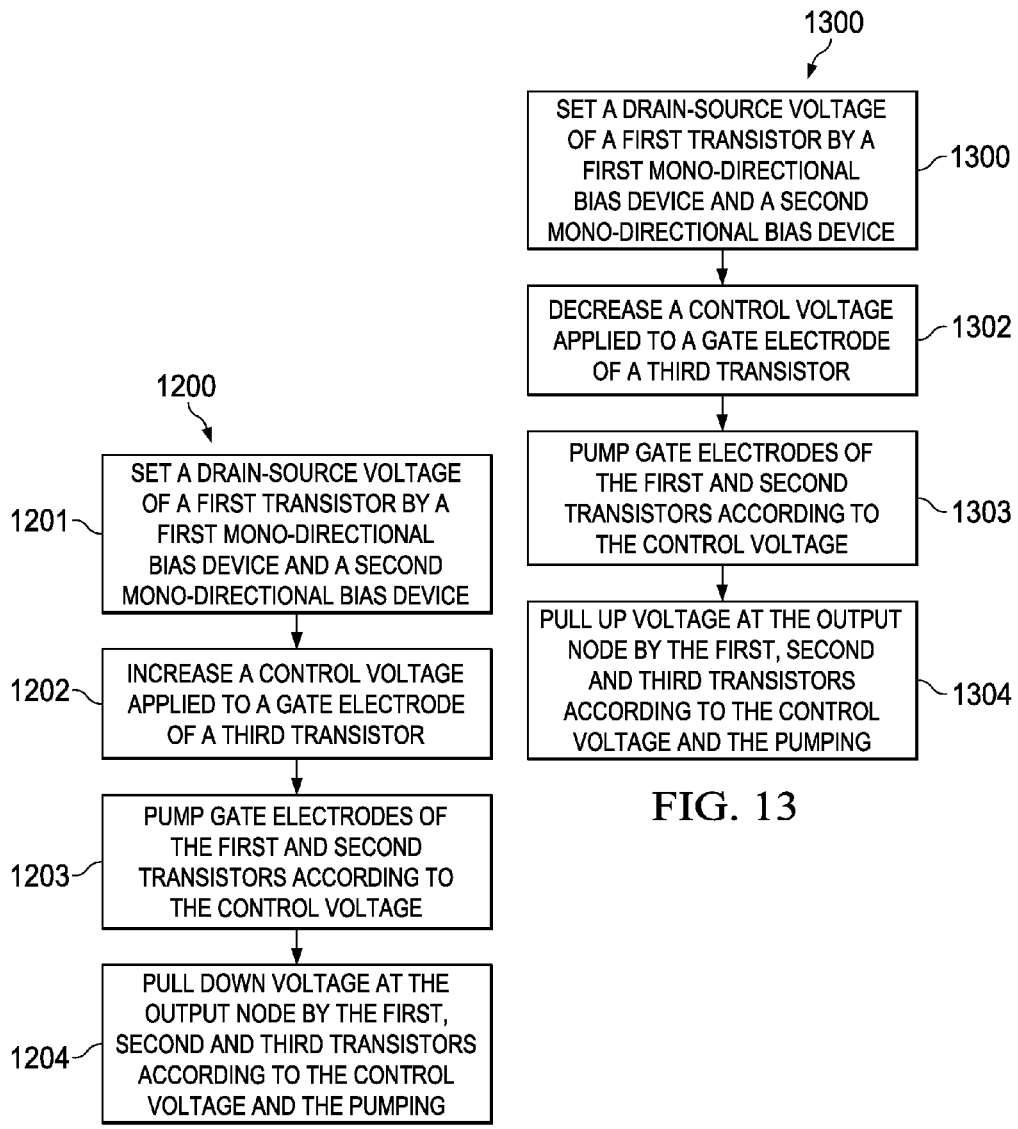

OVERDRIVE CIRCUITS AND RELATED METHOD

This application claims the benefit of U.S. Patent Provisional Application Ser. No. 61/695,590, filed on Aug. 31, 2012, entitled "Overdrive Circuits and Related Method," which application is hereby incorporated herein by reference.

BACKGROUND

Integrated circuits interface with other integrated circuits through input/output (I/O) circuitry. Not all integrated circuits use the same voltage conditions, however. In modern processes, for example, integrated circuits commonly operate at any of 1.8 Volts, 2.5 Volts, and 3.3 Volts. Thus, a 1.8 Volt integrated circuit may boost its voltage output to interface with a 2.5 Volt or 3.3 Volt integrated circuit, and a 3.3 Volt integrated circuit may drop its voltage output to interface with a 2.5 Volt or 3.3 Volt integrated circuit.

Not only do integrated circuits operate at different voltages, but integrated devices within the integrated circuits may also operate at different voltages. Thus, a 1.8 Volt integrated circuit may include core logic devices that operate at 0.9 Volts. The core logic devices are typically faster, and consume less power than standard devices in the 1.8 Volt integrated circuit. Although the core logic devices are faster and consume less power, they are also more fragile, having lower tolerance for high voltage biasing. I/O devices typically operate at higher voltages, such as 1.8 Volts, but have drawbacks of higher power consumption and slower speed. As a result, when an integrated circuit using mainly core logic devices for signal processing is required to interface with a legacy integrated circuit, or an integrated circuit using an older process node (and thus higher nominal operating voltage), I/O devices are used as an interface between the core logic devices and the legacy integrated circuit. Understandably, conversion from the core logic device voltage (0.9 Volts) to the I/O device voltage (1.8 Volts) is required to output the relatively lower voltage signals from the core logic devices to the I/O devices, and another conversion is required to output the voltage signals at the I/O device voltage (1.8 Volts) to the interfaced integrated circuit which operates at a higher voltage (2.5 Volts or 3.3 Volts).

Overdrive buffers are used to provide both conversion from lower operating voltages to higher operating voltages, e.g. 1.8 Volts to 3.3 Volts, and sufficient current supply to drive significant loads at the required output voltage.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 8 is a more detailed circuit diagram of the pull-up circuit operating in an initial state where the pad is at logic low voltage;

FIG. 9 is a diagram showing a transition in the pad voltage from 0 to 2×;

FIG. 10 is a diagram showing settled voltages of the pull-up circuit following the transition from 0 to 2×;

FIG. 12 is a flowchart of a method of operating a pull-down circuit in accordance with various embodiments of the present disclosure; and FIG. 13 is a flowchart of a method of operating a pull-up circuit in accordance with various embodiments of the present disclosure.

DETAILED DESCRIPTION OF ILLUSTRATIVE EMBODIMENTS

Figure 3:
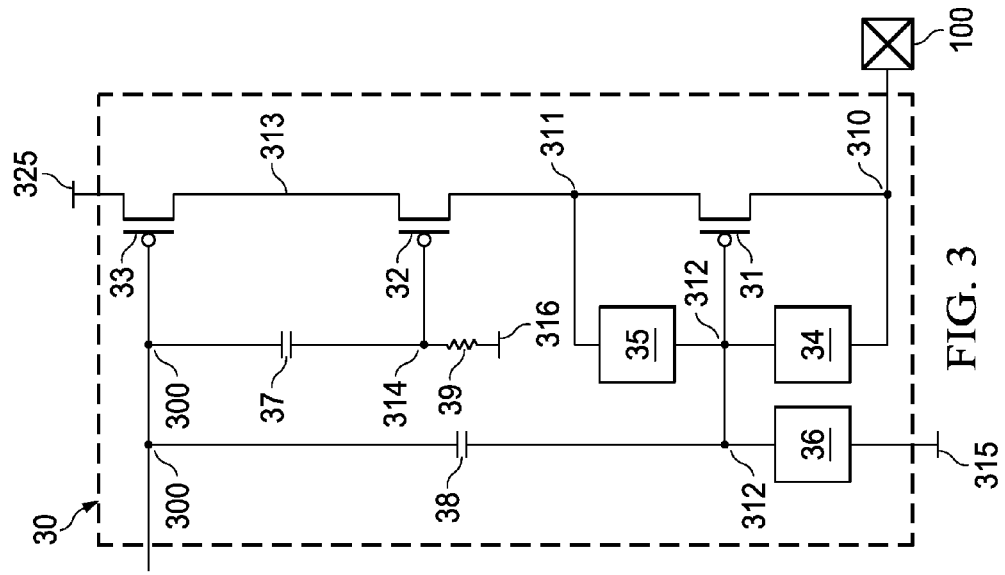
FIGS. 2 and 3 are circuit-level diagrams of pull-down and pull-up circuits of the overdrive circuit in accordance with various embodiments of the present disclosure.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a high-speed, high-reliability 2× (two times) voltage overdrive input/output (I/O) output buffer, and the like. Other embodiments may also be applied, however, to other output buffers.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

I/O output buffer circuits ideally provide an output voltage signal that is independent of load receiving the output voltage signal. In many integrated circuits, overdrive I/O output buffers are used, which not only buffer the output voltage signal, but also perform up-conversion from one operating voltage to another. By their nature, overdrive I/O output buffers put strain on integrated devices thereof. As an example, a 1.8 Volt integrated device in an overdrive I/O output buffer is required to tolerate operating conditions from 0 Volts to 3.3 Volts. In modern processes, however, internal electric fields in metal-oxide-semiconductor field effect transistors (MOSFETs) increase due to disproportionate scaling of device dimensions and supply voltage. Although increased carrier velocities due to the internal electric fields are desirable for improving device speed, the high fields induce hot carrier injection, which adversely affects device reliability. Hot carrier injection (HCI) degrades current driving capability of MOSFETs, which is particularly troublesome for I/O output buffer circuits, which are required to supply sufficient current to drive a variety of loads. Current methods for mitigating HCI largely involve introduction of a costly deep N-well (DNW), which can be used to reduce source-body voltage Vsb (HCI is dependent on Vsb).

In the following disclosure, a novel overdrive output buffer is introduced, which eliminates the need for the deep N-well, and has high speed and reliability (silicon proven with 1000 hours burn-in). The overdrive output buffer uses a novel gate biasing and pumping technique to achieve these advantages. This novel technique is not limited to I/O output buffer design, but can be applied to all overdrive applications. The technique reduces peak Vds/Vsb of MOSFET devices in the circuit to extend device lifetime. Gate pumping pushes operating speed of the circuit to a very high speed. Eliminating the deep N-well saves cost. And, a high-voltage tolerant capacitor realizable by a metal-oxide-metal (MOM) capacitor is introduced which is logic process friendly.

Figure 1:
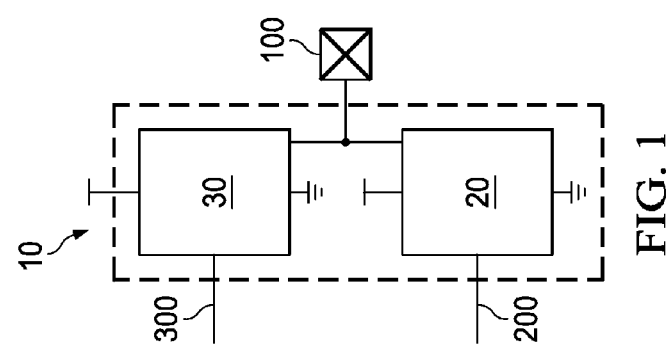
FIG. 1 is a diagram of an overdrive circuit in accordance with various embodiments of the present disclosure.

An overdrive circuit 10, such as an overdrive I/O output buffer, in accordance with various embodiments of the present disclosure is shown in FIG. 1. The overdrive circuit 10 drives a node 100, such as a pad or an internal circuit node, through a pull-down circuit 20 and a pull-up circuit 30. The pull-down circuit 20 receives an input signal at an input node 200, and the pull-up circuit 30 receives an input signal at an input node 300. A logic high level of the input signal at the input node 200 causes the pull-down circuit 20 to pull down output voltage of the node 100 to ground, for example. A logic low level of the input signal at the input node 300 causes the pull-up circuit 30 to pull up output voltage of the node 100 to around twice the logic high level, e.g. 3.3 Volts for a logic high level of 1.8 Volts. As this example shows, it should be appreciated that the term "2×" may be used loosely in the industry to refer to a boosted level that is in the vicinity of twice the original level. The term may refer more to voltage levels of technology nodes that are roughly separated by a factor of two rather than a fixed ratio. Thus, "2×" could refer to anything from 1.5× to 2.5×, for example.

Figure 2:
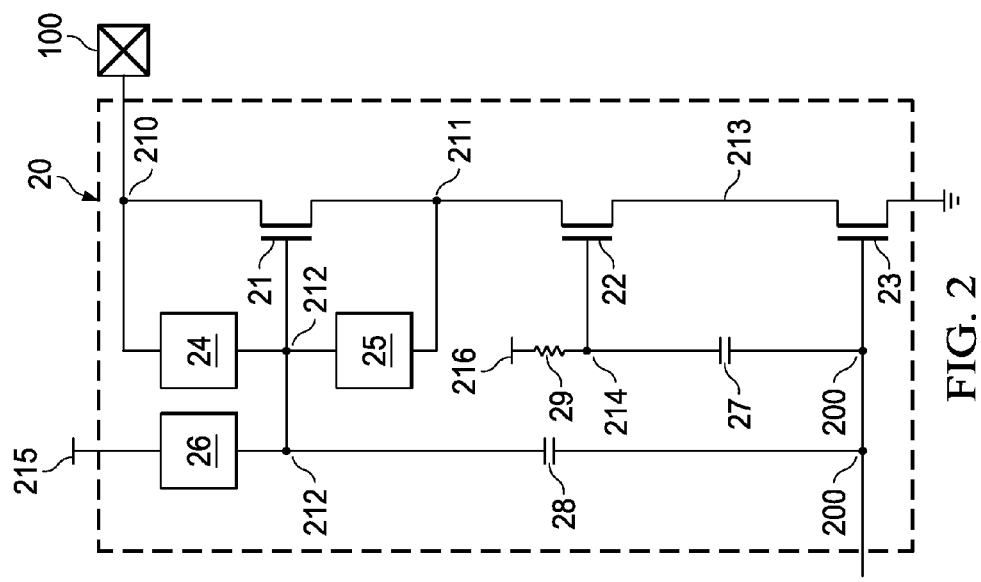

Circuit-level diagrams of the pull-down and pull-up circuits 20, 30 of the overdrive circuit 10 in accordance with various embodiments of the present disclosure are shown in FIGS. 2 and 3. It should be appreciated that the overdrive circuit 10 includes either or both of the pull-down and pull-up circuits 20, 30 presented in the disclosed embodiments. In the pull-down circuit shown in FIG. 2, transistors 21-23 in cascode configuration provide a path from the node 100 to ground. In some embodiments, the transistors 21-23 are N-type MOSFETs. The transistor 21 is a non-deep-N-well transistor in some embodiments. A drain electrode of the transistor 21 is electrically connected to a node 210, which is electrically connected to the node 100. A source electrode of the transistor 21 is electrically connected to a drain electrode of the transistor 22 at a node 211. A mono-directional bias device 24 is electrically connected from the node 210 to a gate of the transistor 21 at a node 212. Mono-directional bias device 25 is electrically connected from the node 212 to the node 211 (from gate to source of the transistor 21). Another mono-directional bias device 26 electrically connects from a voltage supply node 215 to the node 212. In some embodiments, the voltage supply node 215 is biased at a system supply voltage, e.g. 0.9 Volts for core devices, or 1.8 Volts for I/O devices, for example. In some embodiments, the mono-directional bias devices 24-26 are diodes, PN-junctions, diode-connected MOSFETs, or the like. A high voltage tolerant capacitive device 28 is electrically connected from the node 212 to the input node 200. In some embodiments, the high voltage tolerant capacitive device 28 is a metal-oxide-metal (MOM) capacitor.

A drain electrode of the transistor 22 is electrically connected to the source electrode of the transistor 21 at the node 211. A source electrode of the transistor 22 is electrically connected to a drain electrode of the transistor 23 at a node 213. A gate electrode of the transistor 22 is electrically connected to a voltage supply node 216 through a resistive device 29 at a node 214. In some embodiments, the voltage supply node 216 is the same node as the voltage supply node 215, and is biased at a system supply voltage, e.g. 0.9 Volts for core devices, or 1.8 Volts for I/O devices, for example. A capacitive device 27 is electrically connected from the gate electrode of the transistor 22 at the node 214 to the input node 200. In some embodiments, the capacitive device 27 is a metal-oxide-semiconductor (MOS) capacitor. The capacitive device 27 and the resistive device 29 are considered optional, as a middle bias is applied to the gate electrode of the transistor 22 in some embodiments.

A drain electrode of the transistor 23 is electrically connected to the source electrode of the transistor 22 at the node 213. A source electrode of the transistor 23 is grounded. A gate electrode of the transistor 23 is electrically connected to the input node 200.

In the pull-up circuit shown in FIG. 3, transistors 31-33 in cascode configuration provide a path from the node 100 to a voltage supply node 325. In some embodiments, the transistors 31-33 are P-type MOSFETs. A drain electrode of the transistor 31 is electrically connected to a node 310, which is electrically connected to the node 100. A source electrode of the transistor 31 is electrically connected to a drain electrode of the transistor 32 at a node 311. A mono-directional bias device 34 is electrically connected from the node 310 to a gate of the transistor 31 at a node 312. Mono-directional bias device 35 is electrically connected from the node 312 to the node 311 (from gate to source of the transistor 31). Another mono-directional bias device 36 electrically connects from 1× voltage (voltage supply node 315) to the node 312. In some embodiments, the mono-directional bias devices 34-36 are diodes, PN-junctions, diode-connected MOSFETs, or the like. A high voltage tolerant capacitive device 38 is electrically connected from the node 312 to the input node 300. In some embodiments, the high voltage tolerant capacitive device 38 is a metal-oxide-metal (MOM) capacitor.

A drain electrode of the transistor 32 is electrically connected to the source electrode of the transistor 31 at the node 311. A source electrode of the transistor 32 is electrically connected to a drain electrode of the transistor 33 at a node 313. A gate electrode of the transistor 32 is electrically connected to 1× voltage through a resistive device 39 at a node 314. A capacitive device 37 is electrically connected from the gate electrode of the transistor 32 at the node 314 to the input node 300. In some embodiments, the capacitive device 37 is a metal-oxide-semiconductor (MOS) capacitor. The capacitive device 37 and the resistive device 39 are considered optional, as a middle bias is applied to the gate electrode of the transistor 32 in some embodiments.

A drain electrode of the transistor 33 is electrically connected to the source electrode of the transistor 32 at the node 313. A source electrode of the transistor 33 is electrically connected to the voltage supply node 325. In some embodiments, the voltage supply node 325 is biased at an overdrive voltage, e.g. 1.8 Volts for 0.9-Volt core devices, or 3.3 Volts for 1.8-Volt I/O devices, for example. A gate electrode of the transistor 33 is electrically connected to the input node 300.

Figure 4:
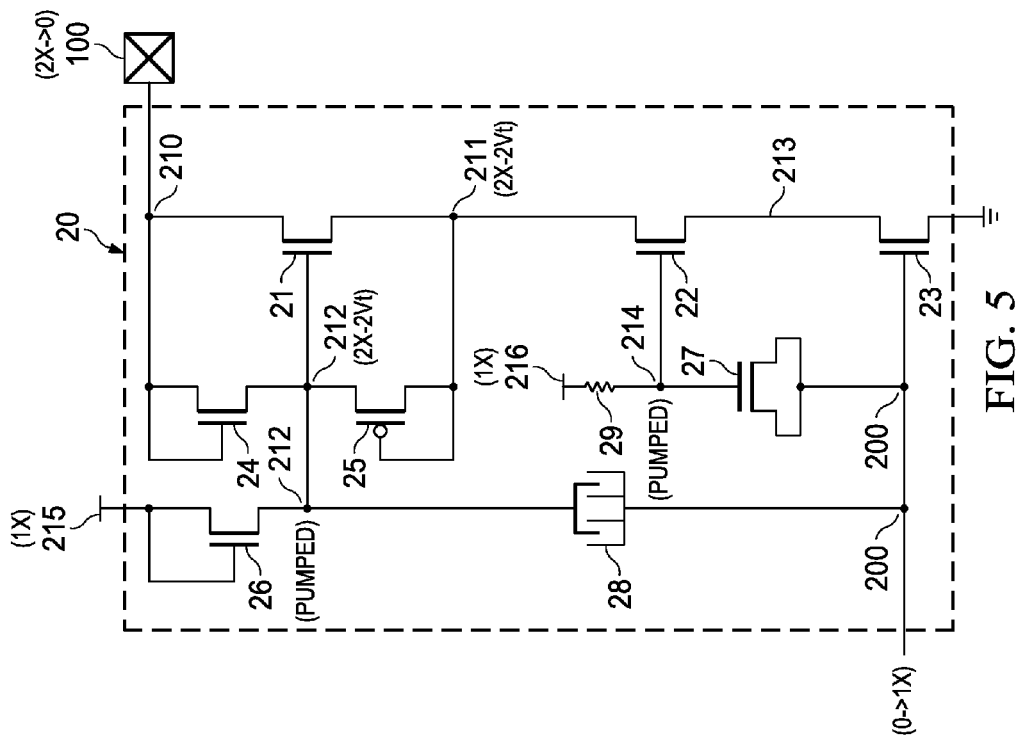
FIG. 4 is a more detailed circuit diagram of the pull-down circuit operating in an initial state where the pad is at logic high voltage.

A more detailed circuit diagram of the pull-down circuit 20 operating in an initial state where the pad 100 is at logic high voltage is shown in FIG. 4. Structurally, the pull-down circuit 20 in FIG. 4 is realized with diode-connected transistors for the mono-directional bias devices 24, 25, 26, a MOM capacitor for the high voltage tolerant capacitive device 28, and a MOS capacitor for the capacitive device 27. The mono-directional bias devices 24, 26 are realized as N-type MOSFETs, and the mono-directional bias device 25 is realized as a P-type MOSFET.

Figure 7:
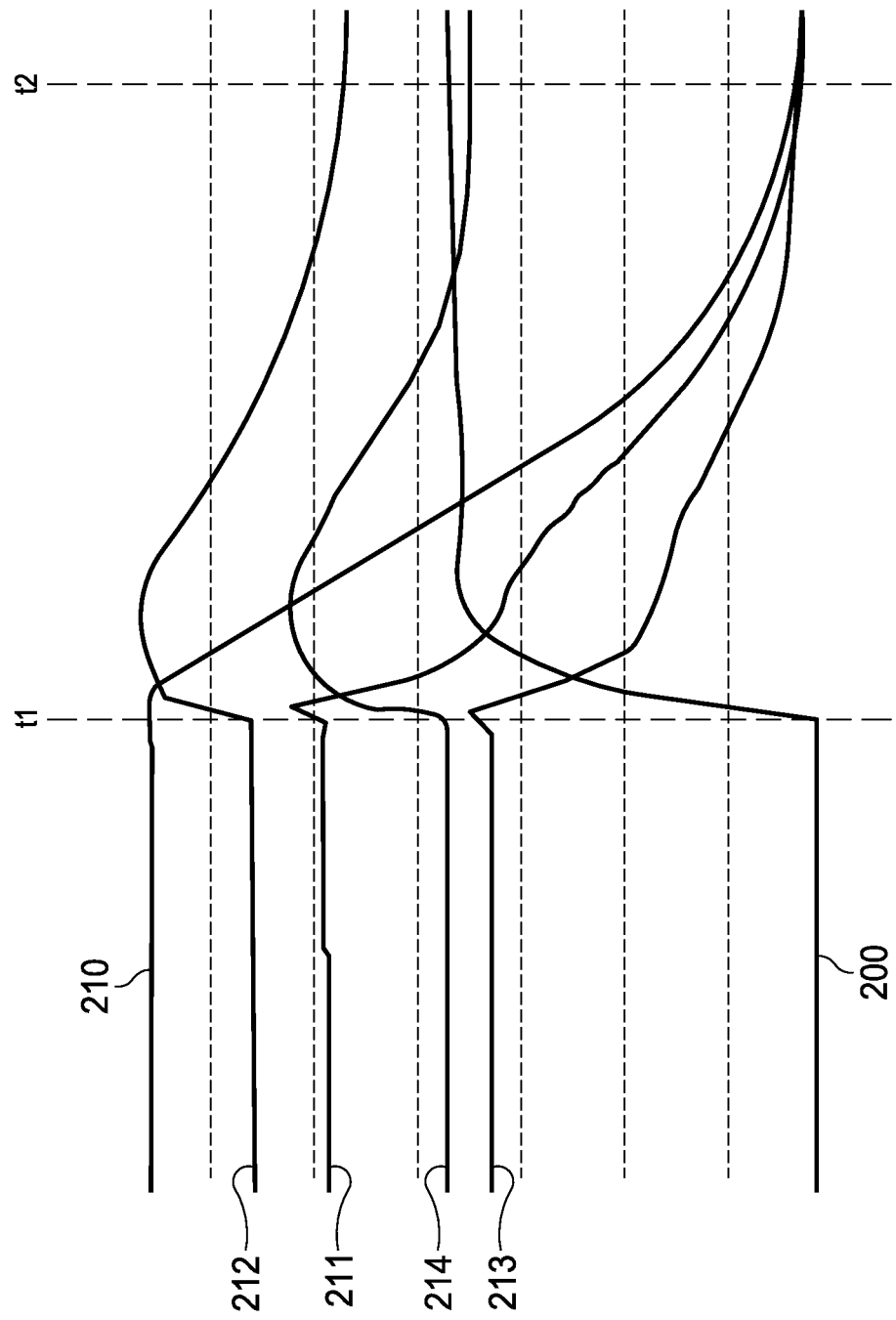
FIG. 7 is a waveform diagram showing voltages of various nodes of the pull-down circuit in the high-to-low transition of FIGS. 4 to 6.

Waveforms of various nodes within the pull-down circuit 20 are shown in FIG. 7. With reference to both FIG. 4 and FIG. 7, with the input node 200 biased at a logic low voltage (0), the pad 100 (the node 210) is initially at logic high voltage (2× voltage). The mono-directional bias device 24 introduces a threshold voltage (Vt) drop at the node 212 for a voltage of 2×–Vt. This puts a maximum voltage stress of 2×–Vt on the MOM capacitor 28, which is well within tolerable levels for the MOM capacitor 28, which can normally tolerate >2× voltage stress. The mono-directional bias device 25 introduces another Vt drop at the node 211, for a voltage at the source of the transistor 21 of 2×–2Vt. As the bulk of the transistor 21 is biased at ground, for example, introducing two Vt drops reduces Vsb (source-bulk voltage) of the transistor 21, which greatly reduces HCI damage during operation. Thus, the transistor 21 can be a non-DNW transistor, which saves masks, and reduces cost. At the transistor 22, the MOS capacitor 27 (the node 214) is charged to 1× voltage through the resistor 29 electrically connected to the voltage supply node 216. The input node 200 being biased at low voltage, e.g. ground, keeps the transistor 23 turned off, so that little to no current flows through the transistors 21, 22, 23, and the voltage at the node 210 ("pad voltage") is kept pulled up at 2× (by the pull-up circuit 30). The node 213 is initially at 1×–Vt due to a Vt drop through the transistor 22.

Figure 5:
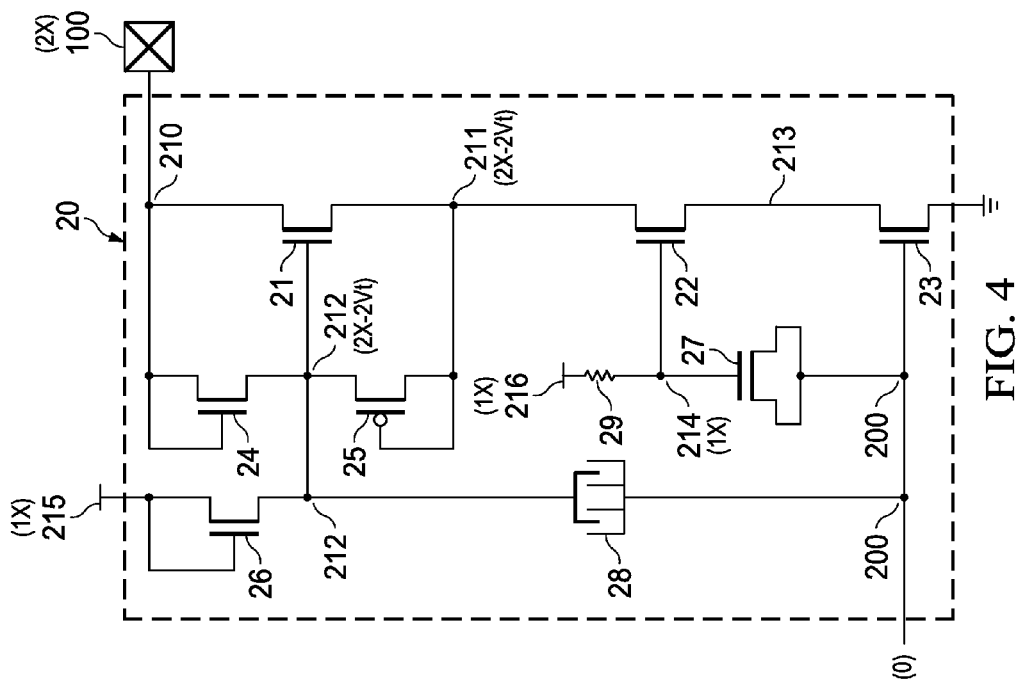
FIG. 5 is a diagram showing a transition in the pad voltage from 2× to 0.

A transition in the pad voltage from 2× to 0 (ground, a negative voltage, or the like) is depicted in FIG. 5. The transition starts from time t1 shown in FIG. 7. When the voltage at the input node 200 is increased from 0 to 1×, e.g. from ground to 1.8 Volts, the node 212 corresponding to the gate of the transistor 21 is pumped by capacitive coupling of the MOM capacitor 28. This is depicted as a sharp rise in the voltage at the node 212 in FIG. 7. The node 214 corresponding to the gate of the transistor 22 is also pumped by the increasing voltage on the input node 200 through the MOS capacitor 27. This is depicted as a sharp rise in the voltage at the node 214 in FIG. 7. As a result, the transistors 21, 22 operate at very high speed and in a safe operation area (SOA), in which biasing levels of the transistors 21, 22, such as drain-source voltage Vds, gate-source voltage Vgs, and bulk-source voltage Vbs, are in ranges that will not adversely degrade lifetime of the transistors 21, 22. This can be seen, for example in the case of Vds distribution of the transistors 21, 22, in the roughly uniform separations of the waveforms of the nodes 210, 211, and 213 after the time t1 shown in FIG. 7. The separation between the waveforms for the nodes 210 and 211 corresponds to Vds of the transistor 21, and the separation between the waveforms for the nodes 211 and 213 corresponds to Vds of the transistor 22.

Figure 6:
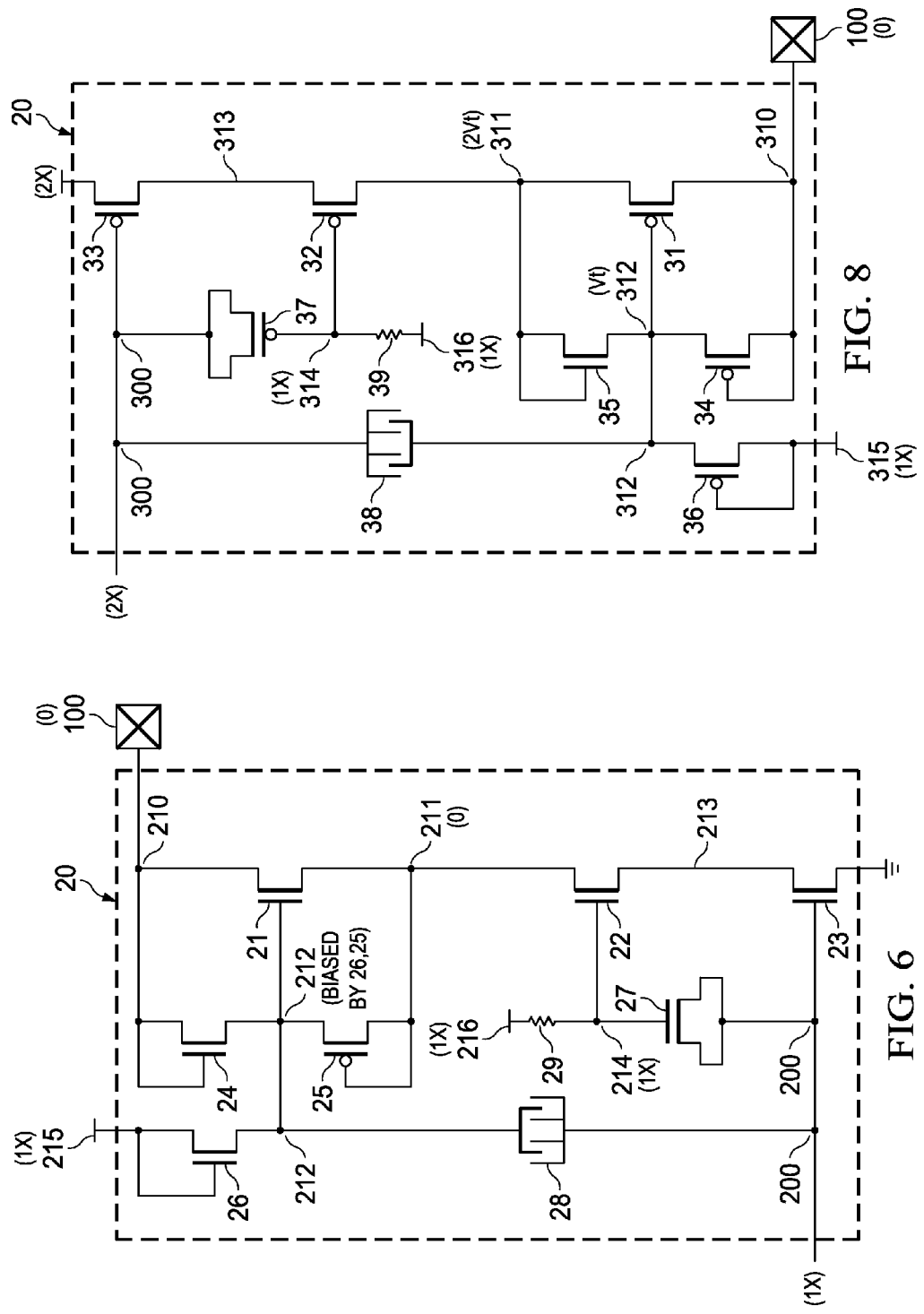
FIG. 6 is a diagram showing settled voltages of the pull-down circuit following the transition from 2× to 0.

After a period of time from time t1 to time t2, for example, voltages on the various nodes settle to levels depicted in FIGS. 6 and 7. The input voltage on the input node 200 stabilizes to around 1×, while the pad voltage at the node 210 and the voltages on the nodes 211 and 213 corresponding to the transistors 21, 22 settle to 0 (ground, negative voltage, or the like). Voltage on the node 214 corresponding to the gate of the transistor 22 falls back to 1× due to discharging through the resistor 29 to the voltage supply node 216 at 1×. Final voltage of the node 212 corresponding to the gate of the transistor 21 is determined by the mono-directional bias devices 26, 25, while the mono-directional bias device 24 is turned off due to reverse biasing from the node 212 to the node 210.

A more detailed circuit diagram of the pull-up circuit 30 operating in an initial state where the pad 100 is at logic low voltage is shown in FIG. 8. Structurally, the pull-up circuit 30 in FIG. 8 is realized with diode-connected transistors for the mono-directional bias devices 34, 35, 36, a MOM capacitor for the high voltage tolerant capacitive device 38, and a MOS capacitor for the capacitive device 37. The mono-directional bias devices 34, 36 are realized as P-type MOSFETs, and the mono-directional bias device 35 is realized as an N-type MOSFET.

Figure 11:
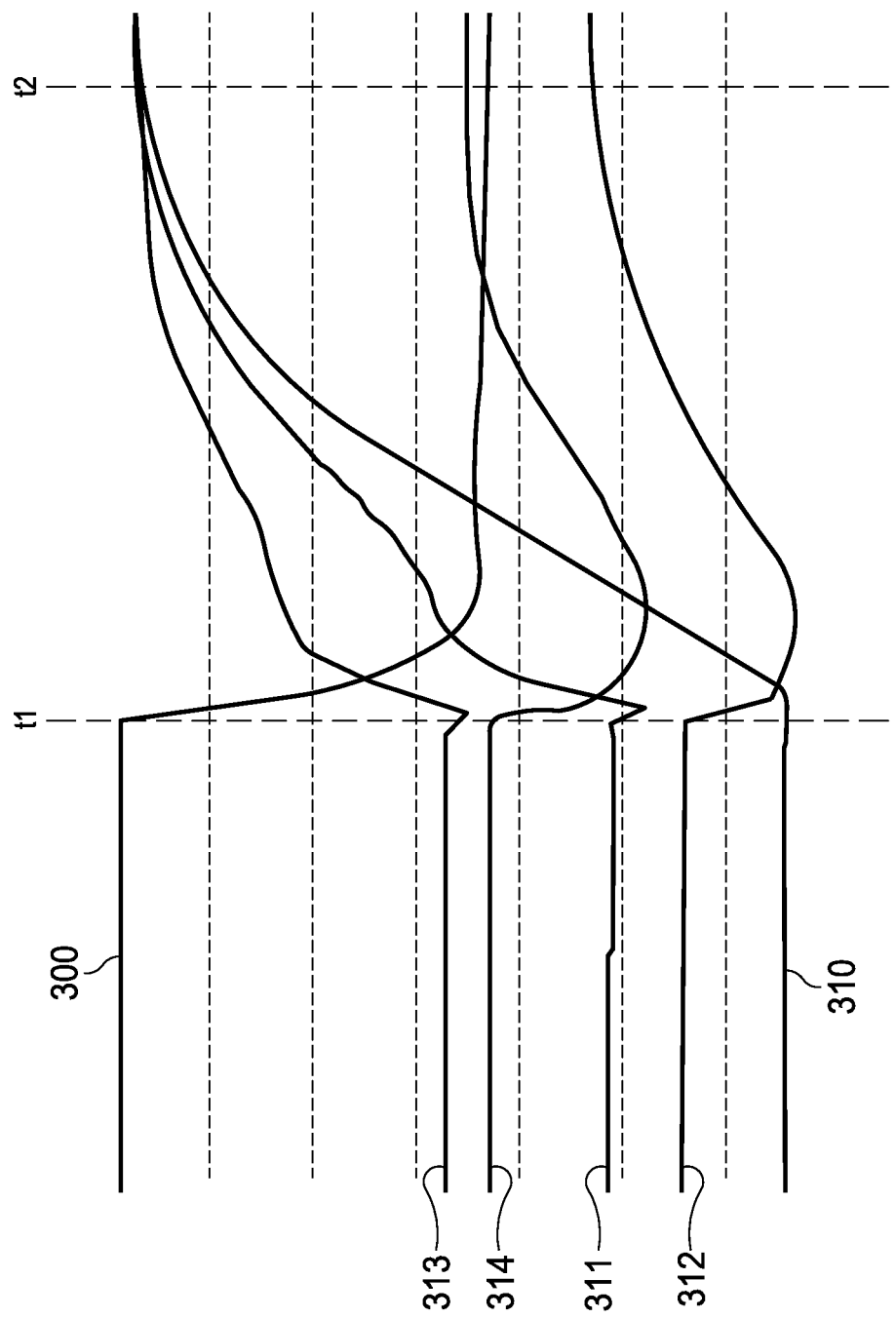
FIG. 11 is a waveform diagram showing voltages of various nodes of the pull-up circuit in the low-to-high transition of FIGS. 8 to 10.

Waveforms of various nodes within the pull-up circuit 30 are shown in FIG. 11. With reference to both FIG. 8 and FIG. 11, with the input node 300 biased at a logic high voltage (2×), the pad 100 (the node 310) is initially at logic low voltage (0). The mono-directional bias device 34 introduces a threshold voltage (Vt) bump at the node 312 for a voltage of Vt. This puts a maximum voltage stress of 2×–Vt on the MOM capacitor 38, which is well within tolerable levels for the MOM capacitor 38, which can normally tolerate >2× voltage stress. The mono-directional bias device 35 introduces another Vt bump at the node 311, for a voltage at the source of the transistor 31 of 2Vt. As the bulk of the transistor 31 is biased at 1× to 2×, for example, introducing two Vt bumps reduces Vbs (source-bulk voltage) of the transistor 31, which greatly reduces HCI damage during operation. At the transistor 32, the MOS capacitor 37 (the node 314) is charged to 1× voltage through the resistor 39 electrically connected to the voltage supply node 316. The input node 300 being biased at high voltage, e.g. 2×, keeps the transistor 33 turned off, so that little to no current flows through the transistors 31, 32, 33, and the voltage at the node 310 ("pad voltage") is kept pulled down at 0 (by the pull-down circuit 20). The node 313 is initially at 1×+Vt due to a Vt bump through the transistor 32.

A transition in the pad voltage from 0 (ground, a negative voltage, or the like) to 2× is depicted in FIG. 9. The transition starts from time t1 shown in FIG. 11. When the voltage at the input node 300 is decreased from 2× to 1×, e.g. from 3.3 Volts to 1.8 Volts, the node 312 corresponding to the gate of the transistor 31 is pumped by capacitive coupling of the MOM capacitor 38. This is depicted as a sharp drop in the voltage at the node 312 in FIG. 11. The node 314 corresponding to the gate of the transistor 32 is also pumped by the decreasing voltage on the input node 300 through the MOS capacitor 37. This is depicted as a sharp drop in the voltage at the node 314 in FIG. 11. As a result, the transistors 31, 32 operate at very high speed and in a safe operation area (SOA), in which biasing levels of the transistors 31, 32, such as source-drain voltage Vsd, source-gate voltage Vsg, and source-bulk voltage Vbs, are in ranges that will not adversely degrade lifetime of the transistors 31, 32. This can be seen, for example in the case of Vsd distribution of the transistors 31, 32, in the roughly uniform separations of the waveforms of the nodes 310, 311, and 313 after the time t1 shown in FIG. 11. The separation between the waveforms for the nodes 310 and 311 corresponds to Vsd of the transistor 31, and the separation between the waveforms for the nodes 311 and 313 corresponds to Vsd of the transistor 32.

After a period of time from time t1 to time t2, for example, voltages on the various nodes settle to levels depicted in FIGS. 10 and 11. The input voltage on the input node 300 stabilizes to around 1×, while the pad voltage at the node 310 and the voltages on the nodes 311 and 313 corresponding to the transistors 31, 32 settle to 2×. Voltage on the node 314 corresponding to the gate of the transistor 32 rises back to 1× due to charging through the resistor 39 by the voltage supply node 316 at 1×. Final voltage of the node 312 corresponding to the gate of the transistor 31 is determined by the mono-directional bias devices 36, 35, while the mono-directional bias device 34 is turned off due to reverse biasing from the node 312 to the node 310.

Pulling down voltage at a node, such as the pad 100 or an internal node of an integrated circuit, can be performed by a method 1200 shown in FIG. 12. The method 1200 can be used with the pull-down circuit 20 of FIG. 2, as an example. The drain-source voltage Vds of the first transistor 21 is set through the mono-directional bias devices 24, 25 in block 1201. In some embodiments, the drain-source voltage Vds is set to 2Vt. Taking into account that similar type devices of integrated circuits may have different parameters due to process variation, it is expected that 2Vt will not be exactly twice Vt of either of the two constituent devices, but instead will be the sum of the different Vt's of the two devices. This is especially true for different device types. Thus, Vt of the mono-directional bias device 24 shown in FIG. 4 and Vt of the mono-directional bias device 25 in the same Figure are most likely different. Thus, the actual drain-source voltage of the transistor 21 is set by the sum of two threshold voltages, which may be called "2Vt" for convenience.

The control voltage applied to the gate electrode of the third transistor 23 is increased in block 1202. In some embodiments, the increase is from 0 to 1×, as shown in FIGS. 5 and 7. In some embodiments, the increase is from ground to a first logic voltage, such as 0.9 Volts, 1.8 Volts, 2.5 Volts, or the like. In some other embodiments, the increase is from a negative voltage to the first logic voltage, e.g. from −0.45 Volts to 0.45 Volts, −0.9 Volts to 0.9 Volts, or the like.

The gate electrodes of the first and second transistors 21, 22 are pumped according to the control voltage in block 1203. In some embodiments, this is accomplished through use of the MOM capacitor 28 and the MOS capacitor 27, respectively. In some embodiments, the MOM capacitor 28 pumps the gate electrode of the first transistor 21 due to the increase in the control voltage transferred to the gate electrode of the first transistor 21 through capacitive coupling of the MOM capacitor 28. In some embodiments, the MOS capacitor 27 pumps the gate electrode of the second transistor 22 due to the increase in the control voltage transferred to the gate electrode of the second transistor 22 through capacitive coupling of the MOS capacitor 27. Embodiments in which only the gate electrode of the first transistor 21 is pumped are contemplated herein. In some embodiments, a middle bias is applied to the gate electrode of the second transistor 22 in lieu of the RC configuration (elements 29 and 27) shown in FIG. 2.

Voltage at the node, which is the pad 100 or the internal node of the integrated circuit in some embodiments, is pulled down by the first, second, and third transistors 21-23 according to at least the control voltage and the pumping of the gate electrodes in block 1204. The control voltage turns on the transistor 23, and the pumping of the gate electrodes of the transistors 21-22 turns on the transistors 21-22. In the embodiments using the middle bias applied to the second transistor 22 instead of the capacitive and resistive devices 27, 29, the voltage at the node is pulled down by the first, second, and third transistors 21-23 according to the control voltage, the middle bias, and the pumping of the gate electrodes.

Pulling up voltage at a node, such as the pad 100 or the internal node of the integrated circuit, can be performed by a method 1300 shown in FIG. 13. The method 1300 can be used with the pull-up circuit 30 of FIG. 3, as an example. The source-drain voltage Vsd of the first transistor 31 is set through the mono-directional bias devices 34, 35 in block 1301. In some embodiments, the source-drain voltage Vsd is set to 2Vt. Taking into account that similar type devices of integrated circuits may have different parameters due to process variation, it is expected that 2Vt will not be exactly twice Vt of either of the two constituent devices, but instead will be the sum of the different Vt's of the two devices. This is especially true for different device types. Thus, Vt of the mono-directional bias device 34 shown in FIG. 8 and Vt of the mono-directional bias device 35 in the same Figure are most likely different. Thus, the actual drain-source voltage of the transistor 31 is set by the sum of two threshold voltages, which may be called "2Vt" for convenience.

The control voltage applied to the gate electrode of the third transistor 33 is decreased in block 1302. In some embodiments, the decrease is from 2× to 1×, as shown in FIGS. 9 and 11. In some embodiments, the decrease is from a first logic voltage to a second logic voltage, such as from 3.3 Volts to 1.8 Volts, or the like. In some other embodiments, the decrease is from the first logic voltage to ground, e.g. from 1.8 Volts to 0 Volts, or the like.

The gate electrodes of the first and second transistors 31, 32 are pumped according to the control voltage in block 1303. In some embodiments, this is accomplished through use of the MOM capacitor 38 and the MOS capacitor 37, respectively. In some embodiments, the MOM capacitor 38 pumps the gate electrode of the first transistor 31 due to the decrease in the control voltage transferred to the gate electrode of the first transistor 31 through capacitive coupling of the MOM capacitor 38. In some embodiments, the MOS capacitor 37 pumps the gate electrode of the second transistor 32 due to the decrease in the control voltage transferred to the gate electrode of the second transistor 32 through capacitive coupling of the MOS capacitor 37. Embodiments in which only the gate electrode of the first transistor 31 is pumped are contemplated herein. In some embodiments, a middle bias is applied to the gate electrode of the second transistor 32 in lieu of the RC configuration (elements 39 and 37) shown in FIG. 3.

Voltage at the node, which is the pad 100 or the internal node of the integrated circuit in some embodiments, is pulled up by the first, second, and third transistors 31-33 according to at least the control voltage and the pumping of the gate electrodes in block 1304. The control voltage turns on the transistor 33, and the pumping of the gate electrodes of the transistors 31-32 turns on the transistors 31-32. In the embodiments using the middle bias applied to the second transistor 32 instead of the capacitive and resistive devices 37, 39, the voltage at the node is pulled up by the first, second, and third transistors 31-33 according to the control voltage, the middle bias, and the pumping of the gate electrodes.

Embodiments may achieve advantages. Use of the mono-directional bias devices 24-26, 34-36, such as diodes, reduces source-bulk and bulk-source biasing in the pull-down and pull-up circuits 20, 30, which is helpful in mitigating HCI, and increasing lifetime. The mono-directional bias devices 24-26 also allow use of the non-DNW transistor 21 in the pull-down and circuit 20, which saves cost and fabrication steps. The MOM capacitors 28, 38 and the MOS capacitors 27, 37 provide gate pumping to the transistors 21-22, 31-32, which increases speed of the pull-down and pull-up circuits 20, 30. Thus, the overdrive output buffer 10 incorporating the pull-down and pull-up circuits 20, 30 has simpler fabrication, higher speed, and longer lifetime.

In accordance with various embodiments of the present disclosure, an overdrive circuit includes a pull-up circuit electrically connected to a first node, and a pull-down circuit. The pull-down circuit includes a first transistor having a drain electrode electrically connected to the first node, a second transistor having a drain electrode electrically connected to a source electrode of the first transistor, and a third transistor having a drain electrode electrically connected to a source electrode of the second transistor. A capacitor has a first electrode electrically connected to a gate electrode of the third transistor, and a second electrode electrically connected to a gate electrode of the first transistor. A first mono-directional bias device has a first electrode electrically connected to the drain electrode of the first transistor, and a second electrode electrically connected to the gate electrode of the first transistor. A second mono-directional bias device has a first electrode electrically connected to the gate electrode of the first transistor, and a second electrode electrically connected to the source electrode of the first transistor.

In accordance with various embodiments of the present disclosure, a method comprises setting a drain-source voltage of a first transistor by a first mono-directional bias device and a second mono-directional bias device, increasing a control voltage applied to a gate electrode of a third transistor, pumping gate electrodes of the first and second transistors according to the control voltage, and pulling down voltage at an output node by the first, second and third transistors according to at least the control voltage and the pumping.

In accordance with various embodiments of the present disclosure, an overdrive circuit includes a pull-down circuit electrically connected to a first node and a low voltage supply node, and a pull-up circuit. The pull-up circuit includes a first transistor having a drain electrode electrically connected to the first node, a second transistor having a drain electrode electrically connected to a source electrode of the first transistor, and a third transistor having a drain electrode electrically connected to a source electrode of the second transistor, and a source electrode electrically connected to a high voltage supply node having voltage higher than voltage of the low voltage supply node. A first capacitor has a first electrode electrically connected to a gate electrode of the third transistor, and a second electrode electrically connected to a gate electrode of the first transistor. A first mono-directional bias device has a first electrode electrically connected to the drain electrode of the first transistor, and a second electrode electrically connected to the gate electrode of the first transistor. A second mono-directional bias device has a first electrode electrically connected to the gate electrode of the first transistor, and a second electrode electrically connected to the source electrode of the first transistor.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An overdrive circuit comprising:
a pull-up circuit electrically connected to a first node; and
a pull-down circuit comprising:
a first transistor having a drain electrode electrically connected to the first node;
a second transistor having a drain electrode electrically connected to a source electrode of the first transistor;
a third transistor having a drain electrode electrically connected to a source electrode of the second transistor;
a capacitor having a first electrode electrically connected to a gate electrode of the third transistor, and a second electrode electrically connected to a gate electrode of the first transistor;
a first mono-directional bias device having a first electrode electrically connected to the drain electrode of the first transistor, and a second electrode electrically connected to the gate electrode of the first transistor; and
a second mono-directional bias device having a first electrode electrically connected to the gate electrode of the first transistor, and a second electrode electrically connected to the source electrode of the first transistor.

2. The overdrive circuit of claim 1, wherein the capacitor is a metal-oxide-metal (MOM) capacitor.

3. The overdrive circuit of claim 1, wherein the pull-down circuit further comprises:
a resistive device having a first electrode electrically connected to a first voltage supply node, and a second electrode electrically connected to a gate electrode of the second transistor; and
a capacitive device having a first electrode electrically connected to the gate electrode of the second transistor, and a second electrode electrically connected to the gate of the third transistor.

4. The overdrive circuit of claim 3, wherein the capacitive device is a metal-oxide-semiconductor (MOS) capacitor.

5. The overdrive circuit of claim 1, wherein the first transistor is a non-deep-N-well transistor.

6. The overdrive circuit of claim 1, wherein a gate electrode of the second transistor is biased by a middle bias.

7. The overdrive circuit of claim 1, wherein the pull-down circuit further comprises:
a third mono-directional bias device having a first electrode electrically connected to a voltage supply node, and a second electrode electrically connected to the gate electrode of the first transistor.

8. In a pull-down circuit comprising a first transistor having a drain electrode electrically connected to an output node, a second transistor having a drain electrode electrically connected to a source electrode of the first transistor, and a third transistor having a drain electrode electrically connected to a source electrode of the second transistor, and a source electrode electrically connected to a low voltage supply node, a method comprising:
setting a drain-source voltage of the first transistor by a first mono-directional bias device and a second mono-directional bias device;
increasing a control voltage applied to a gate electrode of the third transistor;
pumping gate electrodes of the first and second transistors according to the control voltage; and
pulling down voltage at the output node by the first, second and third transistors according to at least the control voltage and the pumping.

9. The method of claim 8, wherein the setting is setting the drain-source voltage of the first transistor to the sum of threshold voltages of the first mono-directional bias device and the second mono-directional bias device.

10. The method of claim 8, wherein the pumping comprises:
- pumping the gate electrode of the first transistor through a high voltage capacitive device; and
- pumping the gate electrode of the second transistor through a capacitive device.

11. The method of claim 10, wherein the high voltage capacitive device is a metal-oxide-metal (MOM) capacitor.

12. The method of claim 10, wherein the capacitive device is a metal-oxide-semiconductor (MOS) capacitor.

13. The method of claim 8, wherein the pulling down comprises:
- turning on the first transistor by the control voltage;
- turning on the second transistor by the pumping; and
- turning on the third transistor by the pumping.

14. The method of claim 8, wherein the pulling down comprises:
- turning on the first transistor by the control voltage;
- turning on the second transistor by application of a middle bias; and
- turning on the third transistor by the pumping.

15. An overdrive circuit comprising:
- a pull-down circuit electrically connected to a first node and a low voltage supply node; and
- a pull-up circuit comprising:
  - a first transistor having a drain electrode electrically connected to the first node;
  - a second transistor having a drain electrode electrically connected to a source electrode of the first transistor;
  - a third transistor having a drain electrode electrically connected to a source electrode of the second transistor, and a source electrode electrically connected to a high voltage supply node having voltage higher than voltage of the low voltage supply node;
  - a first capacitor having a first electrode electrically connected to a gate electrode of the third transistor, and a second electrode electrically connected to a gate electrode of the first transistor;
  - a first mono-directional bias device having a first electrode electrically connected to the drain electrode of the first transistor, and a second electrode electrically connected to the gate electrode of the first transistor; and
  - a second mono-directional bias device having a first electrode electrically connected to the gate electrode of the first transistor, and a second electrode electrically connected to the source electrode of the first transistor.

16. The overdrive circuit of claim 15, wherein the pull-down circuit further comprises;
- a fourth transistor having a drain electrode electrically connected to the first node;
- a fifth transistor having a drain electrode electrically connected to a source electrode of the fourth transistor;
- a sixth transistor having a drain electrode electrically connected to a source electrode of the fifth transistor, and a source electrode electrically connected to the low voltage supply node;
- a second capacitor having a first electrode electrically connected to a gate electrode of the sixth transistor, and a second electrode electrically connected to a gate electrode of the fourth transistor;
- a third mono-directional bias device having a first electrode electrically connected to the drain electrode of the fourth transistor, and a second electrode electrically connected to the gate electrode of the fourth transistor; and
- a fourth mono-directional bias device having a first electrode electrically connected to the gate electrode of the fourth transistor, and a second electrode electrically connected to the source electrode of the fourth transistor.

17. The overdrive circuit of claim 16, wherein the first capacitor and the second capacitor are metal-oxide-metal (MOM) capacitors.

18. The overdrive circuit of claim 16, wherein the fourth transistor is a non-deep-N-well transistor.

19. The overdrive circuit of claim 16, wherein:
the pull-up circuit further comprises:
- a first resistive device having a first electrode electrically connected to a first voltage supply node, and a second electrode electrically connected to a gate electrode of the second transistor; and
- a first capacitive device having a first electrode electrically connected to the gate electrode of the second transistor, and a second electrode electrically connected to the gate of the third transistor; and the pull-down circuit further comprises:
- a second resistive device having a first electrode electrically connected to a third voltage supply node, and a second electrode electrically connected to a gate electrode of the fifth transistor; and
- a second capacitive device having a first electrode electrically connected to the gate electrode of the fifth transistor, and a second electrode electrically connected to the gate of the sixth transistor.

* * * * *